United States Patent
Kim et al.

(10) Patent No.: US 10,437,109 B2
(45) Date of Patent: Oct. 8, 2019

(54) DISPLAY DEVICE AND MANUFACTURING METHOD THE SAME

(71) Applicant: SAMSUNG DISPLAY CO., LTD., Yongin-si, Gyeonggi-do (KR)

(72) Inventors: Kyungho Kim, Seongnam-si (KR); Hyukjin Kim, Asan-si (KR); Donghyeon Ki, Asan-si (KR); Byoungsun Na, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/287,823

(22) Filed: Oct. 7, 2016

(65) Prior Publication Data
US 2017/0199411 A1    Jul. 13, 2017

(30) Foreign Application Priority Data
Jan. 11, 2016    (KR) .......................... 10-2016-0003078

(51) Int. Cl.
*G02F 1/1339* (2006.01)
*G02F 1/1333* (2006.01)
(Continued)

(52) U.S. Cl.
CPC ........ *G02F 1/13394* (2013.01); *G02F 1/1333* (2013.01); *G02F 1/1368* (2013.01);
(Continued)

(58) Field of Classification Search
CPC ........... G02F 1/13394; G02F 1/136209; G02F 1/1368; G02F 1/136286; G02F 1/1333;
(Continued)

(56) References Cited

U.S. PATENT DOCUMENTS

2005/0140892 A1* 6/2005 Kim .................. G02F 1/133707
349/139
2009/0046307 A1    2/2009 Kwak et al.
(Continued)

FOREIGN PATENT DOCUMENTS

JP    2014102511 A    6/2014
KR    20110027986 A  * 3/2011
(Continued)

OTHER PUBLICATIONS

English translation of KR 20130013110 A, Title: Liquid Crystal Display Device and Method for Manufacturing the Same, Author: Kim Seung Gyun, Kwon Woo Hyun, Lee Myoung Ho and Jung Sang Chul; Date of publication: Feb. 6, 2013.*
(Continued)

*Primary Examiner* — Shan Liu
(74) *Attorney, Agent, or Firm* — Cantor Colburn LLP

(57) ABSTRACT

A display device includes: a base substrate, on which first and second light blocking areas extending in first and second directions, respectively, and a pixel area are defined; a gate line above the base substrate in the first light blocking area; a data line above the base substrate in the second light blocking area; thin film transistors connected to the gate and data lines; a color filters above the base substrate in the pixel area, where the color filters have an island shape; a step-difference compensation portion above thin film transistors; a pixel electrode above the color filter in the pixel area; a black matrix above the step-difference compensation portion in the first light blocking area; and main and sub column spacers protruding from the black matrix and spaced apart from each other. The main column spacer overlaps the step-difference compensation portion.

9 Claims, 12 Drawing Sheets

(51) Int. Cl.
*G02F 1/1362* (2006.01)
*G02F 1/1368* (2006.01)
*H01L 27/12* (2006.01)
*H01L 29/786* (2006.01)

(52) U.S. Cl.
CPC .. *G02F 1/136209* (2013.01); *G02F 1/136286* (2013.01); *H01L 27/124* (2013.01); *H01L 27/1222* (2013.01); *H01L 27/1225* (2013.01); *H01L 27/1255* (2013.01); *H01L 27/1288* (2013.01); *H01L 29/7869* (2013.01); *H01L 29/78666* (2013.01); *G02F 2001/13396* (2013.01); *G02F 2001/13398* (2013.01); *G02F 2001/136222* (2013.01)

(58) Field of Classification Search
CPC .. G02F 1/0107; G02F 1/1339; G02F 1/13392; G02F 1/161; G02F 1/133377; G02F 1/133707; G02F 2001/13396; G02F 2001/13398; G02F 1/116; G02F 1/133509; G02F 1/216; G02F 2001/133521; G02F 1/133514; G02F 1/133512; G02F 1/13473; G02F 1/133371; G02F 2001/136222; G02F 2001/136218; G02F 1/13439; G02F 1/1362; G02F 1/136227; G02F 1/1365; G02F 2001/136231; G02F 2001/13625; G02F 2001/1635; G02F 2201/122; G02F 2202/10; G02F 1/133753; G02F 1/3775; G02F 2001/13787; G02F 2001/3548; H01L 27/1225; H01L 27/1222; H01L 29/7869; H01L 27/124; H01L 27/1255; H01L 27/1288; H01L 29/78666; H01L 27/3246; H01L 2021/775; H01L 27/2436; H01L 29/66037; H01L 29/66068; H01L 29/66227; H01L 29/72; H01L 29/786; H01L 2924/1304; H01L 51/0504; H01L 51/0508; H01L 27/1214–1296; G02B 5/0294; G02B 6/3532; G03G 15/0435; H01J 9/205
USPC ............ 349/155–157, 104–111, 42, 43, 129; 257/59, 72
See application file for complete search history.

(56) References Cited

U.S. PATENT DOCUMENTS

| | | | | |
|---|---|---|---|---|
| 2010/0085515 | A1* | 4/2010 | Kim | G02F 1/133514 349/106 |
| 2011/0187631 | A1* | 8/2011 | Lee | G09G 3/36 345/87 |
| 2012/0038867 | A1* | 2/2012 | Kwon | G02F 1/133514 349/110 |
| 2014/0049717 | A1* | 2/2014 | Kwak | G02F 1/133512 349/43 |
| 2015/0103296 | A1 | 4/2015 | Kwak et al. | |

FOREIGN PATENT DOCUMENTS

| | | | |
|---|---|---|---|
| KR | 20130013110 A | * | 2/2013 |
| KR | 1020130013110 A | | 2/2013 |
| KR | 1020140023710 A | | 2/2014 |
| KR | 1020150043097 A | | 4/2015 |

OTHER PUBLICATIONS

English translation of KR 20110027986 A, Title: Liquid Crystal Display Pannel and Fabricating Method of Thereof, Author: Lee Byung Hyun, Kong Min Suk and Woo Chang Seung; Date of publication: Mar. 17, 2011.*

* cited by examiner

DISPLAY DEVICE AND MANUFACTURING METHOD THE SAME

This application claims priority to Korean Patent Application No. 10-2016-0003078, filed on Jan. 11, 2016, and all the benefits accruing therefrom under 35 U.S.C. § 119, the content of which in its entirety is herein incorporated by reference.

BACKGROUND

1. Field

Exemplary embodiments of the invention relate to a display device and a method of manufacturing the display device, and more particularly, to a display device that may be provided through a simple manufacturing process and readily repaired and to a method of manufacturing the display device.

2. Description of the Related Art

Display devices are classified into liquid crystal display ("LCD") devices, organic light emitting diode ("OLED") display devices, plasma display panel ("PDP") devices, electrophoretic display ("EPD") devices, and the like, based on a light emitting scheme thereof Among the types of the display devices, an LCD device typically includes a display substrate including an electrode formed thereon, an opposing substrate, and a liquid crystal layer between the display substrate and the opposing substrate. Recently, a color-filter on array ("COA") structure is being applied to the LCD device, in which a color filter is disposed above the display substrate.

In addition, to effectively prevent misalignment in a process of coupling the display substrate, above which the color filter is disposed, and the opposing substrate, above which a light blocking member is disposed, a black matrix on array ("BOA") structure is being applied to the LCD device, in which the color filter and the light blocking member are disposed above the display substrate. Further, a black column spacer ("BCS") structure is being employed to the LCD device, in which a spacer, configured to maintain a uniform cell gap between the display substrate and the opposing substrate, includes the same material as that included in the light blocking member and is integrally formed with the light blocking member.

The BCS structure includes a main column spacer that maintains a cell gap, which is defined as a distance between the display substrate and the opposing substrate, and a sub-column spacer that is spaced apart from the opposing substrate by a predetermined distance and distributes the pressure externally applied to the main column spacer to provide shock absorbing characteristics.

Accordingly, the black column spacer including the main column spacer, the sub-column spacer, the black matrix and the pixel area may be formed using a mask including four areas each having different transmittances.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

In a liquid crystal display ("LCD") display having a black column spacer ("BCS") structure, when the main column spacer, the sub-column spacer and the black matrix having different thicknesses from one another are formed using a single mask, a step difference between the sub-column spacer and the black matrix may not be effective imparted due to a process spread in imparting the step difference.

Exemplary embodiments of the invention are directed to a display device that may reduce a process spread in imparting a step-difference that may occur when forming a black column spacer and to a method of manufacturing the display device.

According to an exemplary embodiment of the invention, a display device includes: a base substrate, on which a first light blocking area extending in a first direction, a second light blocking area extending in a second direction which intersects the first direction, and a pixel area defined by the first light blocking area and the second light blocking area are defined; a gate line above the base substrate in the first light blocking area; a data line above the base substrate in the second light blocking area; a plurality of thin film transistors connected to the gate line and the data line; a plurality of color filters above the base substrate in the pixel area, where the plurality of color filters has an island shape; a step-difference compensation portion above at least one of the plurality of thin film transistors; a pixel electrode above the color filter in the pixel area; a black matrix above the step-difference compensation portion in the first light blocking area; a main column spacer protruding from the black matrix; and a sub-column spacer spaced apart from the main column spacer and protruding from the black matrix. In such an embodiment, the main column spacer overlaps the step-difference compensation portion.

In an exemplary embodiment, the step-difference compensation portion may have an island shape.

In an exemplary embodiment, the color filter may include at least one of red, green, blue, cyan, magenta, yellow and white color filters, and the step-difference compensation portion may be defined by a portion of one of the red, green, blue, cyan, magenta, yellow and white filters.

In an exemplary embodiment, the step-difference compensation portion may be connected to the color filter disposed adjacently thereto.

In an exemplary embodiment, the main column spacer may have a height greater a height that of the sub-column spacer with respect to a surface of the black matrix.

In an exemplary embodiment, the main column spacer and the sub-column spacer may include a same material as a material included in the black matrix.

In an exemplary embodiment, the main column spacer and the sub-column spacer may have about a same thickness as each other.

In an exemplary embodiment, the display device may further include an organic layer between the step-difference compensation portion and the black matrix. The organic layer may include a first portion overlapping the step-difference compensation portion and a second portion not overlapping the step-difference compensation portion, and the first portion may have a height greater than a height of the second portion.

In an exemplary embodiment, a step difference between the first portion and the second portion may be about the same as a step difference between the main column spacer and the sub-column spacer.

In an exemplary embodiment, the black matrix may be in the second light blocking area.

In an exemplary embodiment, the display device may further include an opposing base substrate opposing the base substrate; and a liquid crystal layer between the base substrate and the opposing base substrate.

According to another exemplary embodiment of the invention, a method of manufacturing a display device includes: preparing a base substrate, on which a first light blocking area extending in a first direction, a second light blocking area extending in a second direction which intersects the first direction, and a pixel area defined by the first light blocking area and the second light blocking area are defined; providing a gate line above the base substrate in the first light blocking area; providing a data line above the base substrate in the second light blocking area; providing a plurality of thin film transistors connected to the gate line and the data line; providing a plurality of color filters above the base substrate in the pixel area, the plurality of color filters disposed in an island shape; providing a step-difference compensation portion above at least one of the plurality of thin film transistors; providing a pixel electrode above the color filter in the pixel area; and providing a black matrix, a main column spacer, and a sub-column spacer above the step-difference compensation portion in the first light blocking area. In such an embodiment, the main column spacer overlaps the step-difference compensation portion.

In an exemplary embodiment, the step-difference compensation portion may have an island shape.

In an exemplary embodiment, the step-difference compensation portion may be connected to the color filter disposed adjacent thereto.

In an exemplary embodiment, the providing the color filter and the providing the step-difference compensation portion may be performed in a same process.

In an exemplary embodiment, the providing the black matrix and the providing the main column spacer and the sub-column spacer may be performed in a same process.

In an exemplary embodiment, the providing the black matrix, the main column spacer, and the sub-column spacer may include: coating a photosensitive composition over the base substrate above which the step-difference compensation portion is formed; disposing a mask above the photosensitive composition and irradiating light thereto; and developing and curing the exposed photosensitive composition. The mask may include a transmissive portion, a semi-transmissive portion, and a light blocking portion.

In an exemplary embodiment, the photosensitive composition may be a negative-type photoresist, and the transmissive portion may be disposed above an area to be defined as the main column spacer and an area to be defined as the sub-column spacer.

In an exemplary embodiment, the photosensitive composition may be a positive-type photoresist, and the light blocking portion may be disposed above an area to be defined as the main column spacer and an area to be defined as the sub-column spacer.

In an exemplary embodiment, the main column spacer may have a height greater than a height of the sub-column spacer with respect to a surface of the black matrix.

In an exemplary embodiment, the main column spacer and the sub-column spacer may have about a same thickness as each other.

In an exemplary embodiment, the method may further include providing an organic layer between the step-difference compensation portion and the black matrix.

In an exemplary embodiment, the providing the organic layer may include: providing a first portion of the organic layer which overlaps the step-difference compensation portion and a second portion of the organic layer which does not overlap the step-difference compensation portion in a way such that the first portion has a height greater than a height of the second portion.

In an exemplary embodiment, a step difference between the first portion and the second portion may be about the same as a step difference between the main column spacer and the sub-column spacer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
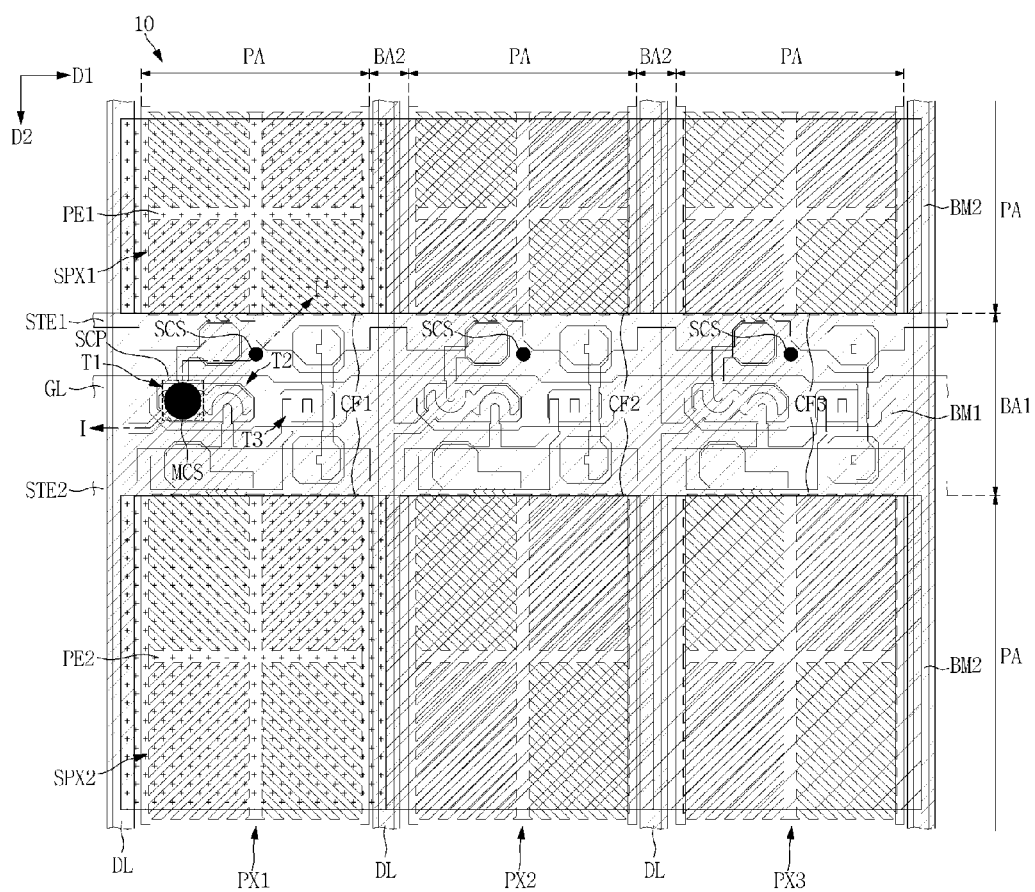
FIG. 1 is a schematic plan view illustrating an exemplary embodiment of a display device.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, thicknesses of a plurality of layers and areas are illustrated in an enlarged manner for clarity and ease of description thereof When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined herein.

Some of the parts which are not associated with the description may not be provided to specifically describe embodiments of the invention, and like reference numerals refer to like elements throughout the specification.

Figure 2:
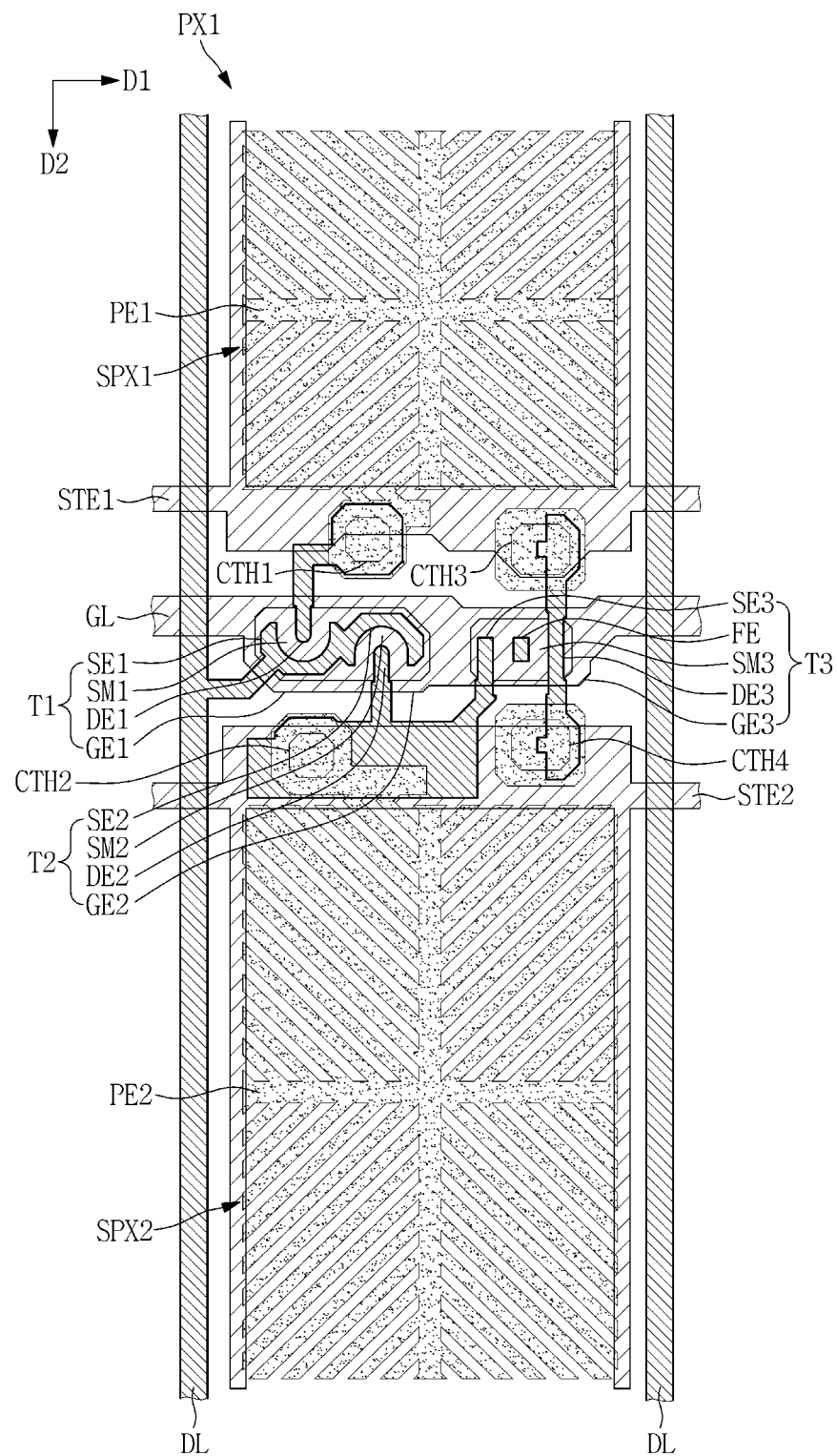
FIG. 2 is a plan view illustrating a pixel of FIG. 1.
Figure 3:
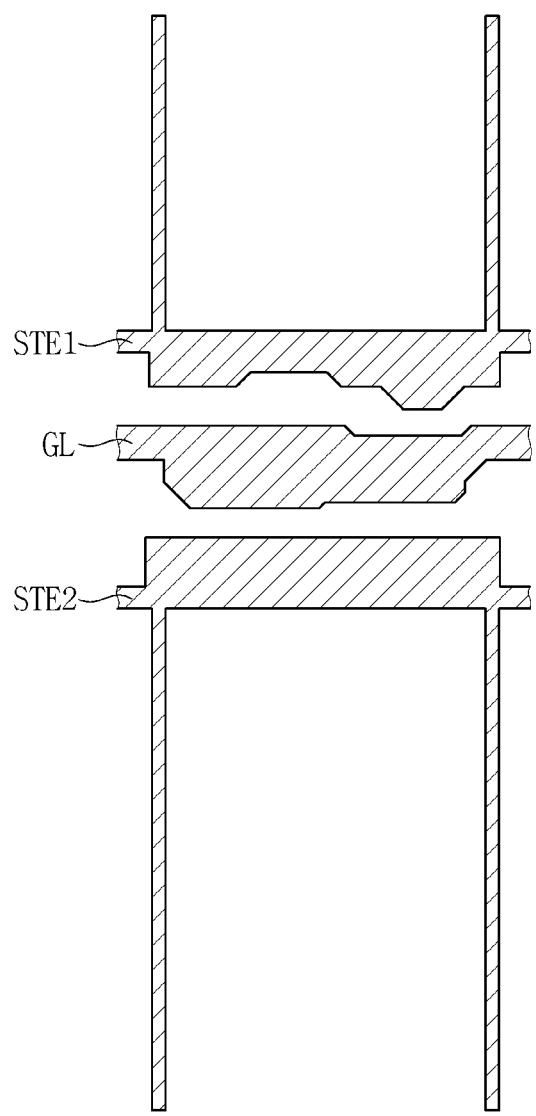
FIG. 3 is a plan view illustrating a gate wiring of the pixel illustrated in FIG. 2.
Figure 4:
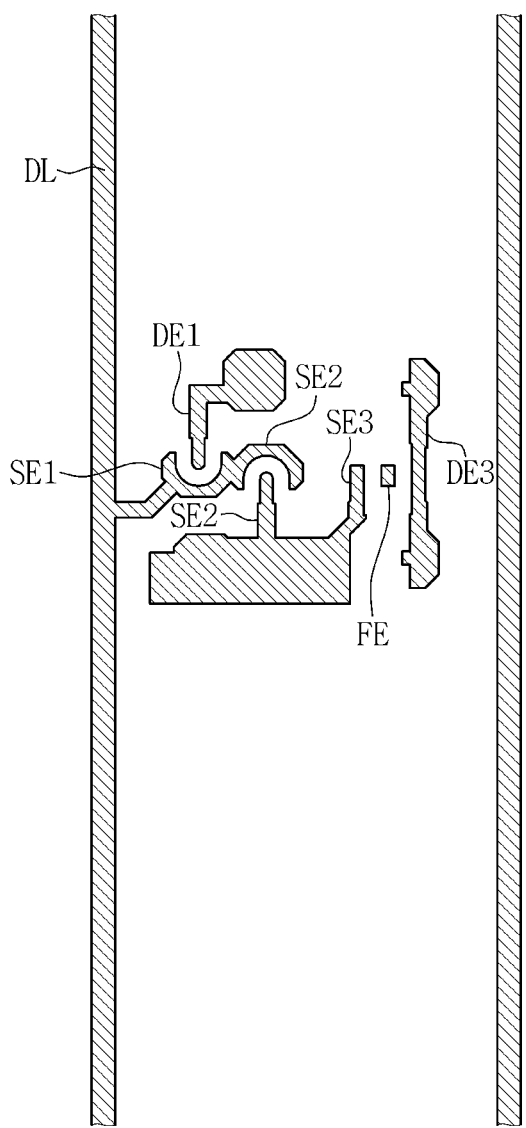
FIG. 4 is a plan view illustrating a data wiring of the pixel illustrated in FIG. 2.
Figure 5:
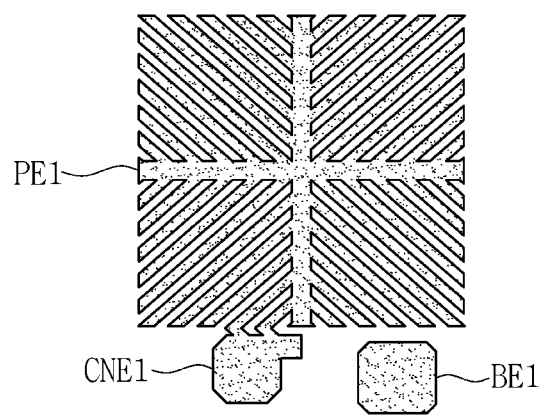
FIG. 5 is a plan view illustrating a pixel electrode of the pixel illustrated in FIG. 2.
Figure 5:
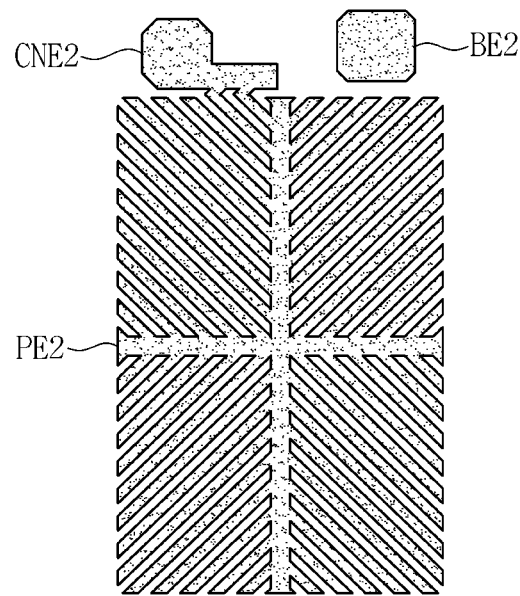

FIG. 1 is a schematic plan view illustrating an exemplary embodiment of a display device, FIG. 2 is a plan view illustrating a pixel of FIG. 1, FIG. 3 is a plan view illustrating a gate wiring of the pixel illustrated in FIG. 2, FIG. 4 is a plan view illustrating a data wiring of the pixel illustrated in FIG. 2, and FIG. 5 is a plan view illustrating a pixel electrode of the pixel illustrated in FIG. 2.

Referring to FIGS. 1, 2, 3, 4 and 5, an exemplary embodiment of a liquid crystal display ("LCD") device 10 includes a plurality of pixels PX1, PX2 and PX3. In such an embodiment, the plurality of pixels PX1, PX2 and PX3 may have substantially the same structure as each other. Hereinafter, one of the plurality of pixels PX1, PX2, and PX3, e.g., a first pixel PX1 (hereinafter, will be referred to as "the pixel PX1") will be mainly described in detail for ease of description.

A planar area of the pixel PX1 includes a pixel area PA in which a first pixel electrode PE1 and a second pixel electrode PE2 are disposed and a light blocking area BA1 and BA2 around the pixel area PA. The light blocking area BA1 and BA2 include a first light blocking area BA1 extending in a first direction D1 and a second light blocking area BA2 extending in a second direction D2 that intersects the first direction D1.

A gate line GL, extending in the first direction D1, and first, second and third thin film transistors T1, T2 and T3 are disposed in the first light blocking area BA1, and a data line DL extending in the second direction D2 is disposed in the second light blocking area BA2.

The pixel PX1 includes a first sub-pixel SPX1 and a second sub-pixel SPX2. The first sub-pixel SPX1 includes a first thin film transistor T1, a first pixel electrode PE1 and a first storage electrode STE'. The second sub-pixel SPX2 includes a second thin film transistor T2, a second pixel electrode PE2, a third thin film transistor T3 and a second storage electrode STE2.

The gate line GL, and the first, second and third thin film transistors T1, T3 and T3 may be disposed in the first light blocking area BA1. The data line DL may be disposed in the second light blocking area BA2. The gate line GL and the data line DL may intersect each other.

The first thin film transistor T1 includes a first gate electrode GE1 branching off from the gate line GL, a first semiconductor layer SM1 overlapping the first gate electrode GE1, a first source electrode SE1 branching off from the data line DL and overlapping the first semiconductor layer SM1, and a first drain electrode DE1 spaced apart from the first source electrode SE1 and overlapping the first semiconductor layer SM1, when viewed from a plan view in a thickness direction of the display device.

The first drain electrode DE1 is connected to the first pixel electrode PE1. In one exemplary embodiment, for example, the first drain electrode DE1 extends toward the first pixel electrode PE1 and is electrically connected to a first connecting electrode CNE1 branching off from the first pixel electrode PE1 through a first contact hole CTH1.

The second thin film transistor T2 includes a second gate electrode GE2 branching off from the gate line GL, a second semiconductor layer SM2 overlapping the second gate electrode GE2, a second source electrode SE2 branching off from the data line DL and overlapping the second semiconductor layer SM2, and a second drain electrode DE2 spaced apart from the second source electrode SE2 and overlapping the second semiconductor layer SM2, when viewed from the plan view in the thickness direction of the display device.

The second drain electrode DE2 is connected to the second pixel electrode PE2. In one exemplary embodiment, for example, the second drain electrode DE2 extends toward the second pixel electrode PE2 and is electrically connected to a second connecting electrode CNE2 branching off from the second pixel electrode PE2 through a second contact hole CTH2.

A third thin film transistor T3 includes a third gate electrode GE3 branching off from the gate line GL, a third semiconductor layer SM3 overlapping the third gate electrode GE3, a third source electrode SE3 branching off from the second drain electrode DE2 and overlapping the third semiconductor layer SM3, a third drain electrode DE3 spaced apart from the third source electrode SE3 and overlapping the third semiconductor layer SM3, and a floating electrode FE between the third source electrode SE3 and the third drain electrode DE3, when viewed from the plan view in the thickness direction of the display device.

The third drain electrode DE3 is connected to the first storage electrode STE1 and the second storage electrode STE2. In one exemplary embodiment, for example, the third drain electrode DE3 extends toward the first storage electrode STE1 to be electrically connected to the first storage electrode STE1 through a third contact hole CTH3 and a first bridge electrode BE1. In such an embodiment, the third drain electrode DE3 extends toward the second storage electrode STE2 to be electrically connected to the second storage electrode STE2 through a second bridge electrode BE2 and a fourth contact hole CTH4.

The first storage electrode STE1 overlaps a portion of the first pixel electrode PE1 to define a first storage capacitor Cstl. The second storage electrode STE2 overlaps a portion of the second pixel electrode PE2 to define a second storage capacitor Cst2. The first storage electrode STE1 and the second storage electrode STE2 receive a storage voltage Vcst.

The floating electrode FE is disposed between the third source electrode SE3 and the third drain electrode DE3 to be spaced apart from the third source electrode SE3 and the third drain electrode DE3, and overlaps a portion of the third semiconductor layer SM3. The floating electrode FE may include a plurality of floating electrodes FE or alternatively, the floating electrode FE may be omitted.

Each of the first and second pixel electrodes PE1 and PE2 includes a cross-shaped stem portion and a plurality of branch portions extending from the stem portion. The first and second pixel electrodes PE1 and PE2 may further include the first and second connecting electrodes CNE1 and CNE2 branching off from a corresponding branch portion and extending therefrom, respectively. However, exemplary embodiments are not limited thereto, and the first and second pixel electrodes PE1 and PE2 may have any suitable shape.

Figure 6:
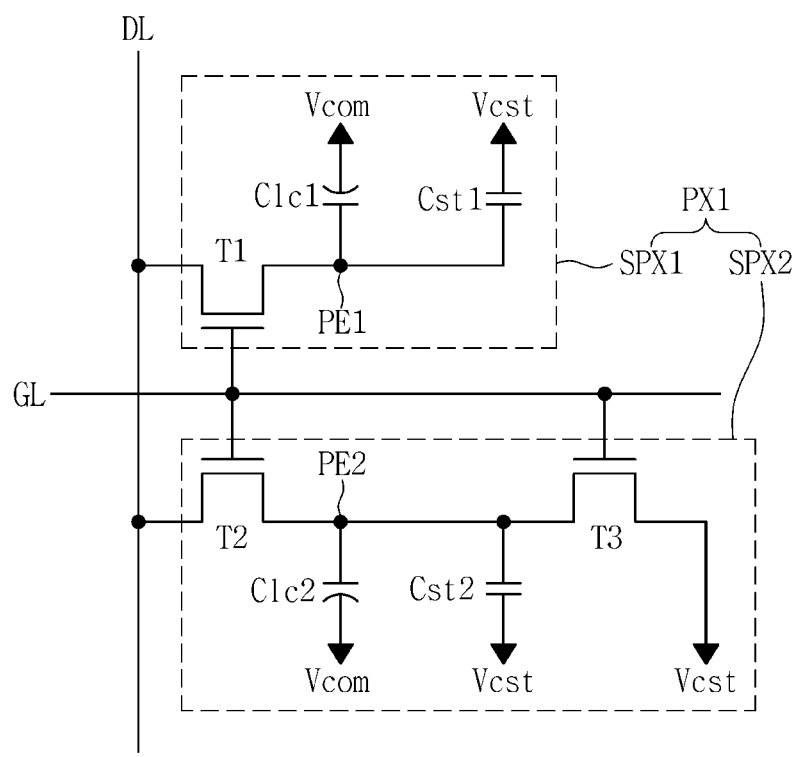
FIG. 6 is an equivalent circuit diagram of a pixel illustrated in FIG. 2.

FIG. 6 is an equivalent circuit diagram of the pixel PX1 illustrated in FIG. 2. Other pixels of the plurality of pixels, e.g., second and third pixels PX2 and PX3 illustrated in FIG. 1, may operate in the same manner as the pixel PX1.

Referring to FIG. 6, the first, second and third thin film transistors T1, T2 and T3 are turned on by a gate signal applied through the gate line GL.

A data voltage is applied to the first sub-pixel SPX1 through the first thin film transistor T1 that is turned on. In one exemplary embodiment, for example, the data voltage applied through the data line DL is applied to the first pixel electrode PE1 of the first sub-pixel SPX1 through the first thin film transistor T1 that is turned on.

A first pixel voltage corresponding to the data voltage is charged to a first liquid crystal capacitor Clc1. In one exemplary embodiment, for example, the first pixel voltage corresponding to a voltage level difference between the data voltage applied to the first pixel electrode PE1 and a common voltage Vcom is charged to the first liquid crystal capacitor Clc1. Accordingly, the first pixel voltage is charged to the first sub-pixel SPX1.

The data voltage is applied to the second sub-pixel SPX2 through the second thin film transistor T2 that is turned on, and the storage voltage Vcst is applied to the second sub-pixel SPX2 through the third thin film transistor T3 that is turned on.

A range of a voltage level of the data voltage is set to be wider than that of the storage voltage Vcst. The common voltage Vcom may be set to have an intermediate value in the range of the voltage level of the data voltage. An absolute value of a voltage level difference between the data voltage and the common voltage Vcom may be set to be greater than an absolute value of a voltage level difference between the storage voltage Vcst and the common voltage Vcom.

A voltage of a contact point between the second thin film transistor T2 and the third thin film transistor T3 is a voltage divided based on resistance values of resistance states when the second thin film transistor T2 and the third thin film transistor T3 are turned on. That is, the voltage of the contact point between the second thin film transistor T2 and the third thin film transistor T3 has a voltage level of about an intermediate value between the data voltage applied through the second thin film transistor T2 that is turned on and the storage voltage Vcst applied through the third thin film transistor T3 that is turned on. The voltage of the contact point between the second thin film transistor T2 and the third thin film transistor T3 is applied to the second pixel electrode PE2. That is, the voltage corresponding to about an intermediate value between the data voltage and the storage voltage Vcst is applied to the second pixel electrode PE2.

A second pixel voltage, which corresponds to a voltage level difference between the voltage applied to the second pixel electrode PE2 and the common voltage Vcom, is charged to a second liquid crystal capacitor Clc2. That is, the second pixel voltage having a voltage level lower than that of the first pixel voltage is charged to the second liquid crystal capacitor Clc2. Accordingly, the second pixel voltage having a lower voltage level than that of the first pixel voltage is charged to the second sub-pixel SPX2.

Through the operation carried out in the aforementioned manner, a viewer may perceive a gray level corresponding to an intermediate value between the first pixel voltage and the second pixel voltage by the pixel PX1.

Figure 7:
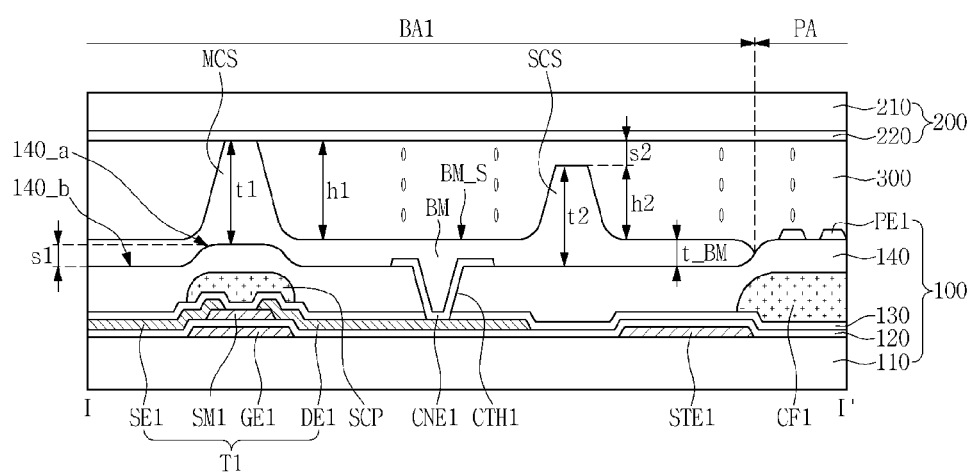
FIG. 7 is a cross-sectional view taken along line I-I' of FIG. 1.

FIG. 7 is a cross-sectional view taken along line I-I' of FIG. 1.

Referring to FIGS. 1, 2 and 7, an exemplary embodiment of the LCD device 10 includes a display substrate 100, an opposing substrate 200, and a liquid crystal layer 300 between the display substrate 100 and the opposing substrate 200. An exemplary embodiment of the LCD device 10 may further include a backlight unit (not illustrated) that outputs light toward the display substrate 100. Herein, the scope of the exemplary embodiments is not limited to the LCD device, and for example, the exemplary embodiments may be applied to an organic light emitting diode ("OLED") device.

A base substrate 110 may be an insulating substrate, such as a plastic substrate, which has light transmitting characteristics and flexibility. However, exemplary embodiments are not limited thereto, and alternatively, the base substrate 110 may include a hard substrate such as a glass substrate.

The gate wiring including, for example, the gate line GL, the first, second and third gate electrodes GE1, GE2 and GE3 branching off from the gate line GL, the first storage electrode STE1, and the second storage electrode STE2, is disposed above the base substrate 110.

The gate wiring may include, or be formed of, aluminum (Al) or alloys thereof, silver (Ag) or alloys thereof, copper (Cu) or alloys thereof, molybdenum (Mo) or alloys thereof, chromium (Cr), tantalum (Ta), titanium (Ti), and/or the like.

In such an embodiment, the gate wiring may have a multilayer structure including two or more conductive layers (not illustrated) having different physical properties from each other. In one exemplary embodiment, for example, a conductive layer of the multilayer structure may include, or be formed of a metal, such as an aluminum (Al)-based metal, a silver (Ag)-based metal, and a copper (Cu)-based metal, which has low resistivity to reduce signal delay or voltage drop, and another conductive layer of the multilayer structure may include a material, such as a molybdenum-based metal, chromium, titanium, and tantalum, which has a high contact property with indium tin oxide ("ITO") and indium zinc oxide ("IZO").

In an alternative exemplary embodiment, the multilayer structure may include a chromium lower layer and an aluminum upper layer, an aluminum lower layer and a molybdenum upper layer, or a titanium lower layer and a copper upper layer. However, the invention is not limited thereto, and the gate wiring may include various kinds and number of layers of metals and conductors. The gate wiring may be simultaneously formed in a same process.

A first insulating layer 120 is disposed above the base substrate 110, above which the gate wiring is disposed. The first insulating layer 120 may also be referred to as a gate insulating layer. The first insulating layer 120 may include silicon oxide ($SiO_x$) or silicon nitride ($SiN_x$). In an exemplary embodiment, the first insulating layer 120 may further include aluminum oxide, titanium oxide, tantalum oxide, or zirconium oxide.

The first, second and third semiconductor layers SM1, SM2 and SM3 are disposed above the first insulating layer 120. The first, second and third semiconductor layers SM1, SM2 and SM3 may include, or be formed of, amorphous silicon or an oxide semiconductor including at least one selected from gallium (Ga), indium (In), tin (Sn) and zinc (Zn). Although not illustrated, an ohmic contact layer (not illustrated) may be disposed above the first, second and third semiconductor layers SM1, SM2 and SM3.

In an exemplary embodiment, the first, second and third semiconductor layers SM1, SM2 and SM3 may substantially overlaps the first, second and third gate electrodes GE1, GE2 and GE3, respectively, but exemplary embodiments are not limited thereto. In an alternative exemplary embodiment, the first, second and third semiconductor layers SM1, SM2 and SM3 may substantially overlap the data wiring to be described further below.

The data wiring including, for example, the date line DL, the first, second and third source electrodes SE1, SE2 and SE3, and the first, second and third drain electrodes DE1, DE2 and DE3, is disposed above the base substrate 111 above which the first, second and third semiconductor layers SM1, SM2 and SM3 are disposed. The data wiring may include the same material as that included in the gate wiring. The data wiring may be simultaneously formed in the same process.

A second insulating layer 130 is disposed above the base substrate 110 above which the data wiring is disposed. The second insulating layer 130 may also be referred to as an insulating interlayer. The second insulating layer 130 may have a monolayer structure or a multilayer structure including, for example, silicon oxide, silicon nitride, a photosensitive organic material, or a low dielectric constant (low-k) insulating material, e.g., a-Si:C:O or a-Si:O:F.

Figure 8:
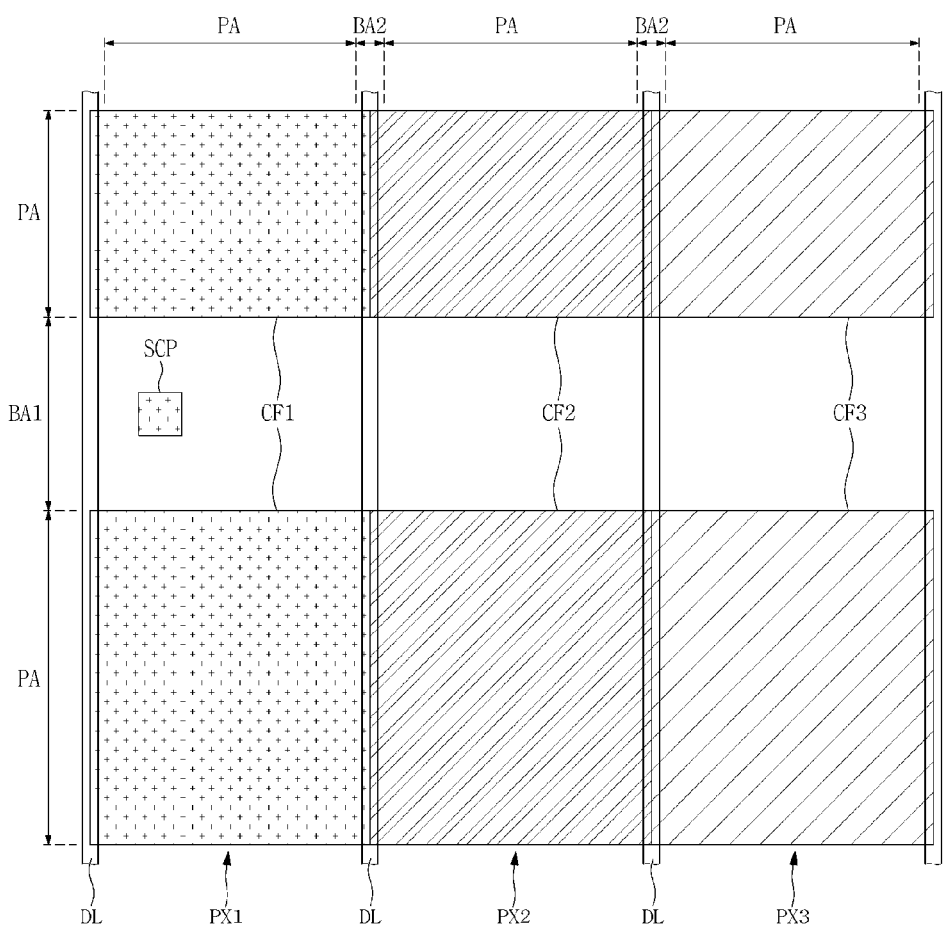
FIG. 8 is a plan view illustrating an exemplary embodiment of a color filter.
Figure 9:
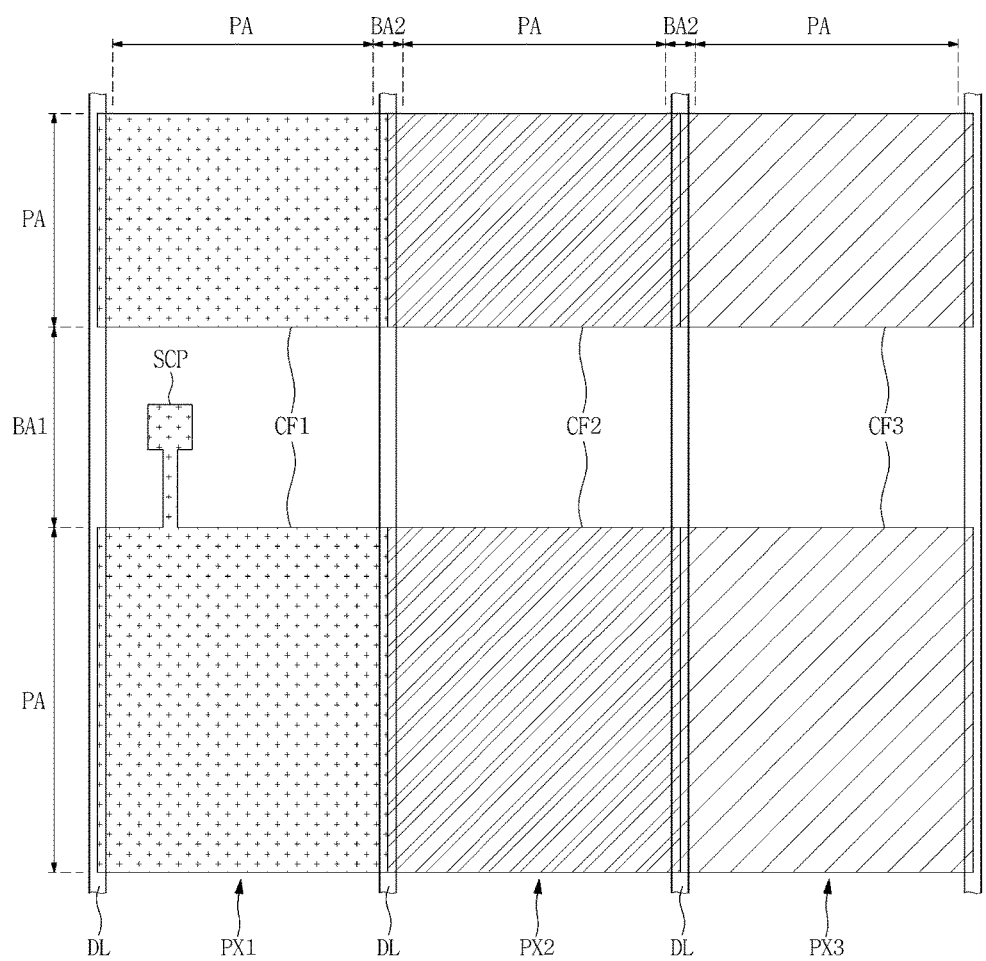
FIG. 9 is a plan view illustrating an alternative exemplary embodiment of a color filter.

FIG. 8 is a plan view illustrating an exemplary embodiment of a color filter, and FIG. 9 is a plan view illustrating an alternative exemplary embodiment of a color filter.

Referring to FIGS. 7 and 8, in an exemplary embodiment, color filters CF1, CF2 and CF3 are disposed above the second insulating layer 130 overlapping the pixel area PA. The color filters CF1, CF2 and CF3 may not overlap the first light blocking area BA1 and may overlap one another in the second light blocking area BA2. In an exemplary embodiment, the color filters CF1, CF2 and CF3 has an island shape. In such an embodiment, the color filters CF1, CF2 and CF3 do not overlap the BA1 when viewed from the plan view in the thickness direction of the display device, such that the color filters of a same color in a same pixel is spaced apart from each other, thereby each the color filters of the same color is in an island shape with respect to each other.

The color filters CF1, CF2 and CF3 may each be one of red, green, blue, cyan, magenta, yellow and white color filters. In an exemplary embodiment, three adjacent pixels including color filters of the three primary colors of red, green and blue, or cyan, magenta and yellow, may define a unit pixel group for color formation.

A step-difference compensation portion SCP is disposed in the first light blocking area BA1. In one exemplary embodiment, for example, the step-difference compensation portion SCP is disposed below a main column spacer MCS to be described below. In an exemplary embodiment of the LCD device 10, as shown in FIGS. 8 and 9, a single main column spacer MCS is provided for every three pixels, and the step-difference compensation portions SCP are provided for every three pixels, but exemplary embodiments are not limited thereto. In an alternative exemplary embodiment, the step-difference compensation portions SCP may be disposed below portions above which the main column spacers MCS are disposed, respectively.

The step-difference compensation portion SCP may have a monolayer structure or a multilayer structure including, for example, a color filter, a photoresist, silicon oxide, silicon nitride, a photosensitive organic material, or a silicon-based low dielectric constant (low-k) insulating material.

In an exemplary embodiment, the step-difference compensation portion SCP may have an island shape (refer to FIG. 8) in a plan view. In an alternative exemplary embodiment, the step-difference compensation portion SCP may be connected to another color filter (e.g., the color filter CF1) that is adjacent thereto in a plan view (refer to FIG. 9). In such an embodiment, the step-difference compensation portion SCP may include the same material as that included in the color filter CF1 that is adjacent thereto. In such an embodiment, the step-difference compensation portion SCP may be simultaneously or integrally formed with the color filter CF1 adjacent thereto in a same process.

Referring to FIGS. 2, 7 and 8, an organic layer 140 is disposed above the base substrate 110 above which the color filters CF1, CF2 and CF3 are disposed. The organic layer 140 may have a monolayer structure or a multilayer structure including silicon oxide, silicon nitride, a photosensitive organic material, or a silicon-based low dielectric constant (low-k) insulating material. The organic layer 140 may have a thickness in a range of about 1.0 µm to about 2.5 µm.

The organic layer 140 includes a first area or portion 140_a overlapping the step-difference compensation portion SCP or the color filter CF1, and a second portion or portion 140_b not overlapping the step-difference compensation portion SCP or the color filter CF1, when viewed from a plan view. The first portion 140_a may have a greater height than that of the second portion 140_b. In such an embodiment, a step difference S1 between the first portion 140_a and the second portion 140_b may be substantially the same as a step difference S2 between the main column spacer MCS and a sub-column spacer SCS to be described below.

The organic layer 140 may include, or be formed of, a negative-type photosensitive composition of which an exposed portion remains and an unexposed portion is developed. Alternatively, the organic layer 140 may include, or be formed of, a positive-type photosensitive composition. In one exemplary embodiment, for example, the organic layer 140 may include, or be formed of, a photosensitive organic material.

The organic layer 140 may have a substantially flat upper surface to planarize upper portions of the first, second and third thin film transistors T1, T2 and T3, and the color filters CF1, CF2 and CF3. Accordingly, the organic layer 140 is also referred to as a planarization layer.

In such an embodiment, a portion of the second insulating layer 130 and a portion of the organic layer 140 are removed, such that the first contact hole CTH1 exposing a portion of the first drain electrode DE1 is defined.

The first pixel electrode PE1 and the second pixel electrode PE2 are disposed above the organic layer 140. The first connecting electrode CNE1 branching off from the first pixel electrode PE1 is electrically connected to the first drain electrode DE1 through the first contact hole CTH1. The second connecting electrode CNE2 branching off from the second pixel electrode PE2 is electrically connected to the second drain electrode DE2 through the second contact hole CTH2.

The first and second pixel electrodes PE1 and PE2 may include, or be formed of, a transparent conductive material. In one exemplary embodiment, for example, the first and second pixel electrodes PE1 and PE2 may include, or be formed of, a transparent conductive material such as ITO, IZO, indium tin zinc oxide ("ITZO"), aluminum zinc oxide ("AZO"), and the like.

Figure 10:
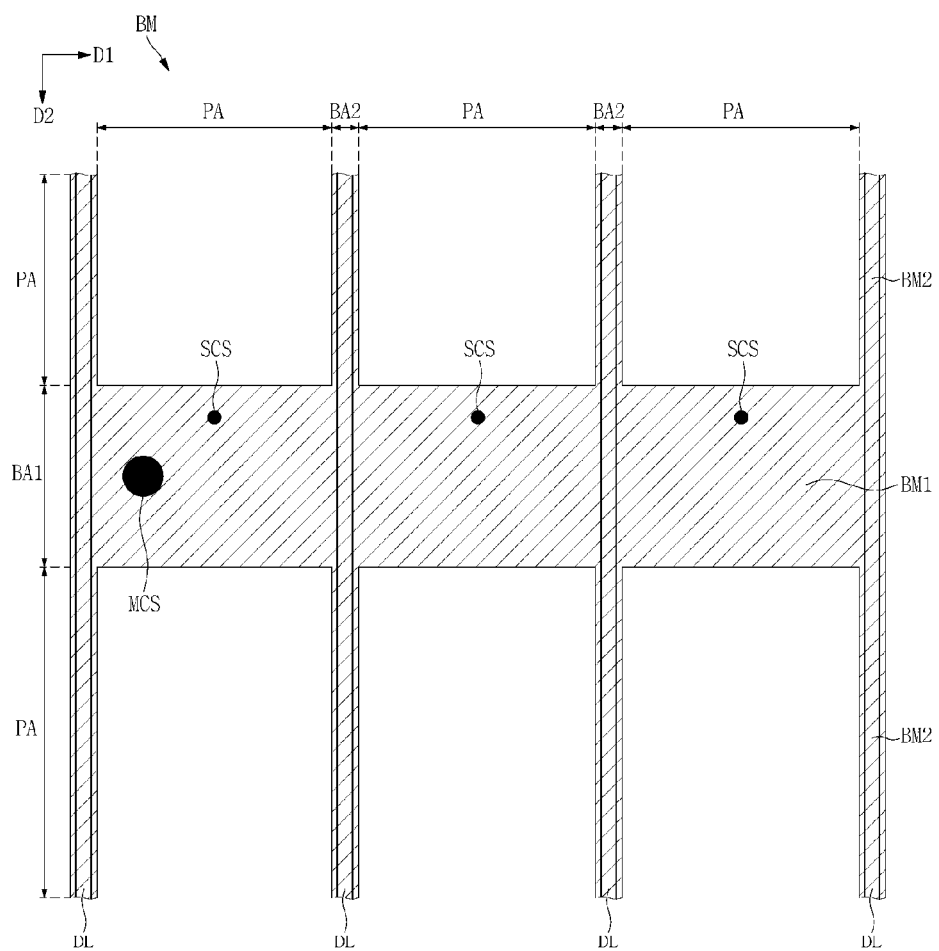
FIG. 10 is a plan view illustrating an exemplary embodiment of a black matrix, a main column spacer, and a sub-column spacer.

FIG. 10 is a plan view illustrating an exemplary embodiment of a black matrix BM, the main column spacer MCS and the sub-column spacer SCS.

Referring to FIGS. 1, 7 and 10, in an exemplary embodiment, the black matrix BM is disposed above the organic layer 140 in the light blocking areas BA1 and BA2. The black matrix BM includes a first black matrix BM1 extending in the first direction D1 and a second black matrix BM2 extending in the second direction D2 that intersects the first direction D1. The first black matrix BM1 is disposed in the first light blocking area BA1, and the second black matrix BM2 is disposed in the second light blocking area BA2. However, exemplary embodiments are not limited thereto, and in an alternative exemplary embodiment, the second black matrix BM2 may be omitted.

The first and second black matrices BM1 and BM2 may overlap a portion (e.g., an edge portion) of the first and second pixel electrodes PE1 and PE2, or may not overlap the first and second pixel electrodes PE1 and PE2, when viewed from a plan view.

The black matrix BM effectively prevents light applied from a backlight unit (not illustrated) from being externally transmitted and also effectively prevents ambient light from being irradiated to the gate line GL, the data line DL, and the first, second and third thin film transistors T1, T2 and T3.

The black matrix BM may have a thickness t_BM in a range of about 0.5 micrometer (µm) to about 2 µm, for example, in a range of about 0.5 µm to about 1.5 µm.

The main column spacer MCS and the sub-column spacer SCS are disposed above the black matrix BM in the first light blocking area BA1. The main column spacer MCS and the sub-column spacer SCS may have a structure protruding from a surface BM_S of the black matrix BM.

The main column spacer MCS and the sub-column spacer SCS are spaced apart from each other and have a step difference S2 with respect to the surface BM_S of the black matrix BM. With respect to the surface BM_S of the black matrix BM, a height h1 of the main column spacer MCS is greater than the height h2 of the sub-column spacer SCS.

The main column spacer MCS may have the height h1 in a range of about 2 µm to about 4 µm with respect to the surface BM_S of the black matrix BM. In one exemplary embodiment, for example, the main column spacer MCS may have the height h1 in a range of about 2.5 µm to about 3.5 µm with respect to the surface BM_S of the black matrix BM.

The sub-column spacer SCS may have the height h2 in a range of about 1 µm to about 3.5 µm with respect to the surface BM_S of the black matrix BM. In one exemplary embodiment, for example, the sub-column spacer SCS may have the height h2 in a range of about 1.5 µm to about 3 µm with respect to the surface BM_S of the black matrix BM.

The main column spacer MCS substantially supports the display substrate 100 and the opposing substrate 200 to secure a space therebetween. In such an embodiment, when a pressure is externally applied, the sub-column spacer SCS distribute the pressure applied to the main column spacer MCS and serves a buffering function.

According to an exemplary embodiment, the black matrix BM, the main column spacer MCS and the sub-column spacer SCS may be integrally formed in a photolithography method using a same material.

The black matrix BM, the main column spacer MCS and the sub-column spacer SCS may include, or be formed of, a negative-type photosensitive composition of which an unexposed portion is developed. In one exemplary embodiment, for example, the photosensitive composition may include a binder resin, a polymerizable monomer, a polymerizable oligomer, a pigment, a dispersant, and a photoinitiator, for example. The pigment may use a black pigment or a black resin.

In such an embodiment, where the black matrix BM, the main column spacer MSC, and the sub-column spacer SCS are integrally formed using the negative-type photosensitive composition, it is desired to accurately pattern the main column spacer MSC and the sub-column spacer SCS to impart a height difference therebetween. Conventionally, to impart such a height difference between a main column spacer and the sub-column spacer, the main column spacer and the sub-column spacer may be provided using masks having different light transmittances, but there has been a difficulty in imparting a step difference between the main column spacer MSC and the sub-column spacer SCS due to a process spread.

According to an exemplary embodiment, a step difference is effectively provided by disposing the step-difference compensation portion SCP below the main column spacer MCS, and the main column spacer MSC and the sub-column spacer SCS are provided using a mask having the same light transmittance, such that a step difference may be readily imparted between the main column spacer MSC and the sub-column spacer SCS.

Accordingly, a thickness t1 of the main column spacer MCS may be substantially the same as a thickness t2 of the sub-column spacer SCS.

At least one of the main column spacer MCS and the sub-column spacer SCS may overlap at least one of the first, second and third thin film transistors T1, T2 and T3.

A lower alignment layer (not illustrated) may be disposed above the first and second pixel electrodes PE1 and PE2 and the black matrix BM. The lower alignment layer may be a homeotropic alignment layer or a photoalignment layer that includes a photopolymerizable material.

The opposing substrate 200 may include an opposing base substrate 210 and a common electrode 220, for example.

The opposing base substrate 210 may be an insulating substrate, such as a plastic substrate, which has light transmitting characteristics and flexibility. However, exemplary embodiments are not limited thereto, and the opposing base substrate 210 may include a hard substrate such as a glass substrate.

The common electrode 220 may be a hole-plate electrode including a transparent conductive oxide such as ITO and IZO, for example. In an alternative exemplary embodiment, the common electrode 220 may have an uneven shape for defining a plurality of domains and at least one slit.

An upper alignment layer (not illustrated) may be disposed above the common electrode 220. The upper alignment layer may be a homeotropic alignment layer or a photoalignment layer that includes a photopolymerizable material.

FIGS. 11A, 11B, 11C, 11D and 11E are cross-sectional views illustrating an exemplary embodiment of a method of manufacturing a display device.

Figure 11A:
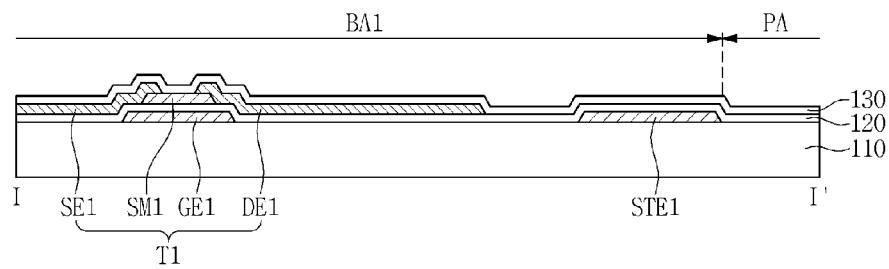
FIGS. 11A, 11B, 11C, 11D and 11E are cross-sectional views illustrating an exemplary embodiment of a method of manufacturing a display device.

Referring to FIG. 11A, a first thin film transistor T1, a second thin film transistor T2 (not illustrated) and a third thin film transistor T3 (not illustrated) are provided or formed above a base substrate 110, which includes or is formed of transparent glass or plastic. Hereinafter, descriptions will be given with respect to the first thin film transistor T1, for ease of description.

A gate wiring including, for example, a first gate electrode GE1 and a first storage electrode STE1, is provided or formed above the base substrate 110. The gate wiring, e.g., the first gate electrode GE1 and the first storage electrode STE1, may be provided or formed on the same layer and may be formed in a same process.

A first insulating layer 120 is provided or coated over the base substrate 110 above which the gate wiring, e.g., the first gate electrode GE1 and the first storage electrode STE1, is provided. The first insulating layer 120 may be formed through a chemical vapor deposition process, a spin coating process, a sputtering process, a vacuum deposition process, or a printing process.

A first semiconductor layer SM1, which overlaps at least a portion of the first gate electrode GE1, is provided or formed above the base substrate 110 above which the first insulating layer 120 is provided.

A data wiring including, for example, a first source electrode SE1 and a first drain electrode DE1, is provided or formed above the base substrate 110 above which the first semiconductor layer SM1 is provided. The first source electrode SE1 is provided or formed to overlap an end of the first semiconductor layer SM1, and the first drain electrode DE1 is spaced apart from the first source electrode SE1 to overlap another end of the first semiconductor layer SM1.

A second insulating layer 130 is provided or coated over the base substrate 110 above which the data wiring, e.g., the first source electrode SE1 and the first drain electrode DE1, is provided. The second insulating layer 130 may be formed through a chemical vapor deposition process, a spin coating process, a sputtering process, a vacuum deposition process, or a printing process.

Figure 11B:
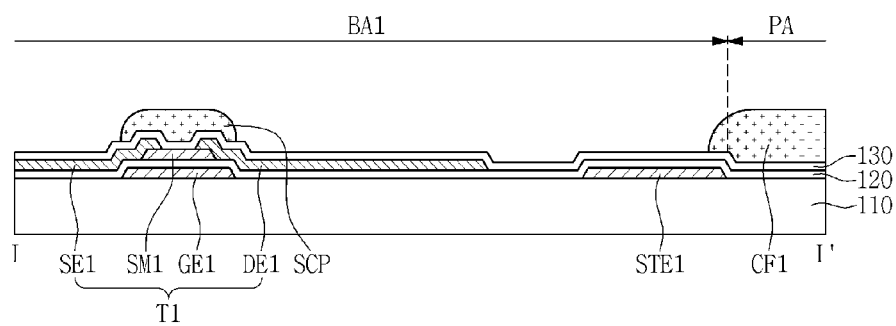

Referring to FIG. 11B, a color filter CF1 is provided or formed in a pixel area PA above the base substrate 110 above which the second insulating layer 130 is provided, and a step-difference compensation portion SCP is provided or formed in a portion to be defined as a main column spacer (not illustrated) to be described below. In an exemplary embodiment, where the main column spacer is provided above the first thin film transistor T1, the step-difference compensation portion SCP may be provided above the first thin film transistor T1.

The step-difference compensation portion SCP may be formed of the same material as that included in the color filter CF1, and the color filter CF1 and the step-difference compensation portion SCP may be integrally or simultaneously formed in the same process.

Figure 11C:
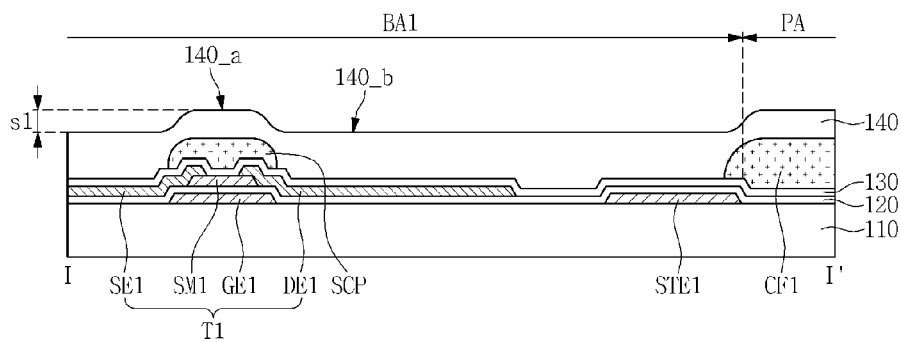

Referring to FIG. 11C, an organic layer 140 is provided or coated over the base substrate 110 above which the step-difference compensation portion SCP and the color filter CF1 are provided. The organic layer 140 may be formed through a chemical vapor deposition process, a spin coating process, a sputtering process, a vacuum deposition process, or a printing process.

The organic layer 140 may include silicon oxide, silicon nitride, a photosensitive organic material, or a silicon-based low dielectric constant (low-k) insulating material, and may have a thickness in a range of about 1.0 µm to about 2.5 µm.

The organic layer 140 includes a first portion 140_a overlapping the step-difference compensation portion SCP or the color filter CF1, and a second portion 140_b not overlapping the step-difference compensation portion SCP or the color filter CF1. The first portion 140_a may have a greater height than that of the second portion 140_b. In such an embodiment, a step difference S1 between the first portion 140_a and the second portion 140_b may be substantially the same as a step difference S2 between the main column spacer MCS and a sub-column spacer SCS to be described below.

Figure 11D:
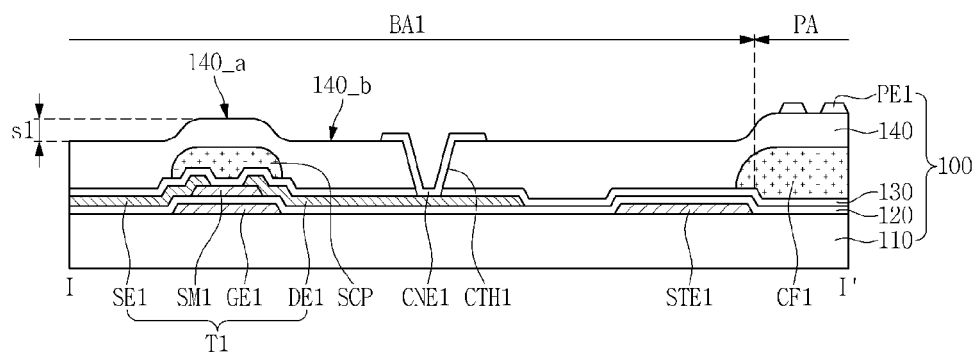

Referring to FIG. 11D, a first contact hole CTH1, which exposes a portion of the first drain electrode DE1, is formed through the second insulating layer 130 and the organic layer 140.

Subsequently, a first pixel electrode PE1 is provided or formed above the organic layer 140 in the pixel area PA. A first connecting electrode CNE1 branching off from the first pixel electrode PE1 is electrically connected to the first drain electrode DE1 through the first contact hole CTH1.

Figure 11E:
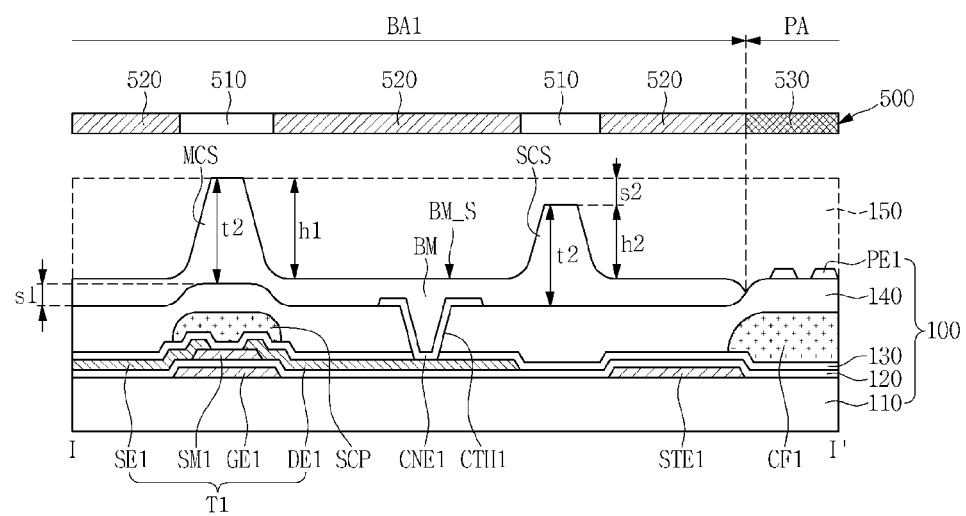

Referring to FIG. 11E, a photosensitive composition 150 for forming a black matrix BM, a main column spacer MSC and a sub-column spacer SCS is provided or coated over the base substrate 110 above which the first pixel electrode PE1 is provided. The photosensitive composition 150 includes a negative-type photosensitive resin composition. In such an embodiment, where the photosensitive composition 150 includes the negative-type photosensitive resin composition, a portion of the negative-type photosensitive composition that is irradiated with light is hardened such that an unexposed portion thereof is removed, but exemplary embodiments are not limited thereto.

The photosensitive composition 150 may include a binder resin, a polymerizable monomer, a polymerizable oligomer, a pigment, a dispersant, and a photoinitiator, for example. The pigment may use a black pigment or a black resin.

Subsequently, a mask 500 is disposed above the base substrate 110 to be spaced apart from the photosensitive composition 150. The mask 500 is a three-tone mask that includes portions having different light transmittances, for example, a transmissive portion 510, a semi-transmissive portion 520 and a light blocking portion 530. In an alternative exemplary embodiment, the mask 500 may include a slit portion in lieu of the semi-transmissive portion 520.

The transmissive portion 510 may have a light transmittance of about 95 percent (%) or higher, the semi-transmissive portion 520 may have a light transmittance in a range of about 15% to about 20%, and the light blocking portion 530 may have a light transmittance of about 5% or lower.

The transmissive portion 510 is disposed above an area to be defined as the main column spacer MSC and the sub-column spacer SCS, the semi-transmissive portion 520 is disposed above an area to be defined as the black matrix BM except the main column spacer MSC and the sub-column spacer SCS, and the light blocking portion 530 is disposed above the pixel area PA.

Since the main column spacer MSC and the sub-column spacer SCS are formed in an area corresponding to the transmissive portion 510, a thickness t1 of the main column spacer MSC may be substantially the same as a thickness t2 of the sub-column spacer SCS.

The main column spacer MCS and the sub-column spacer SCS are spaced apart from each other, and have a step difference S2 with respect to a surface BM_S of the black matrix BM. With respect to the surface BM_S of the black matrix BM, a height h1 of the main column spacer MCS is greater than a height h2 of the sub-column spacer SCS.

The main column spacer MCS may have the height hl in a range of about 2 µm to about 4 µm with respect to the surface BM_S of the black matrix BM. In one exemplary embodiment, for example, the main column spacer MCS may have the height h1 in a range of about 2.5 µm to about 3.5 µm with respect to the surface BM_S of the black matrix BM.

The sub-column spacer SCS may have the height h2 in a range of about 1 µm to about 3.5 µm with respect to the surface BM_S of the black matrix BM. In one exemplary embodiment, for example, the sub-column spacer SCS may have the height h2 in a range of about 1.5 µm to about 3 µm with respect to the surface BM _S of the black matrix BM.

In such an embodiment, the step difference between the main column spacer MSC and the sub-column spacer SCS may be imparted by the step-difference compensation portion SCP below the main column spacer MSC.

Accordingly, four areas, e.g., an area of the main column spacer MSC, an area of the sub-column spacer SCS, an area of the black matrix BM and an area of the pixel area PA, which have different heights from one another, may be provided or formed using a three-tone mask. In such an embodiment, a process for imparting a step-difference that may occur when forming the black column spacer may be simplified, and a period in time and costs of manufacturing the mask may be reduced.

In an exemplary embodiment, where the color filter is absent in the light blocking area, in which the thin film transistor, for example, is disposed, a damage to the color filter may be effectively prevented in a laser repair process.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
    a base substrate, on which a first light blocking area extending in a first direction, a second light blocking area extending in a second direction which intersects the first direction, and a pixel area defined by the first light blocking area and the second light blocking area are defined;
    a gate line above the base substrate in the first light blocking area;
    a data line above the base substrate in the second light blocking area;
    a plurality of thin film transistors connected to the gate line and the data line;
    a plurality of color filters above the base substrate in the pixel area, wherein the plurality of color filters has an island shape;
    a step-difference compensation portion overlapping at least one of the plurality of thin film transistors and disposed between two island-shaped color filters within one pixel;
    a pixel electrode above the plurality of color filters in the pixel area;
    a black matrix above the step-difference compensation portion in the first light blocking area;
    a main column spacer protruding from the black matrix; and
    a sub-column spacer spaced apart from the main column spacer and protruding from the black matrix,
    wherein the step-difference compensation portion overlaps the at least one of the plurality of thin film transistors in a thickness direction of the base substrate, and is disposed between the black matrix and the at least one of the plurality of thin film transistors in the thickness direction of the base substrate,
    wherein the main column spacer overlaps the step-difference compensation portion,
    wherein
    the plurality of color filters comprises at least one of red, green, blue, cyan, magenta, yellow and white color filters,
    the step-difference compensation portion is defined by a portion of one of the red, green, blue, cyan, magenta, yellow and white color filters, and
    the step-difference compensation portion is directly connected to one of the two island-shaped color filters with the one pixel.

2. The display device as claimed in claim 1, wherein the main column spacer has a height greater than a height of the sub-column spacer with respect to a surface of the black matrix.

3. The display device as claimed in claim 1, wherein the main column spacer and the sub-column spacer comprise a same material as a material included in the black matrix.

4. The display device as claimed in claim 3, wherein the main column spacer and the sub-column spacer have about a same thickness as each other.

5. The display device as claimed in claim 1, wherein
the organic layer is disposed between the step-difference compensation portion and the black matrix,
wherein the organic layer comprises:
  a first portion overlapping the step-difference compensation portion; and
  a second portion not overlapping the step-difference compensation portion, and
the first portion of the organic layer has a height greater than a height of the second portion of the organic layer.

6. The display device as claimed in claim 5, wherein a step difference between the first portion and the second portion is about the same as a step difference between the main column spacer and the sub-column spacer.

7. The display device as claimed in claim 1, wherein the black matrix is in the second light blocking area.

8. The display device as claimed in claim 1, further comprising:
  an opposing base substrate opposing the base substrate; and
  a liquid crystal layer between the base substrate and the opposing base substrate.

9. The display device as claimed in claim 1, wherein the black matrix is filled in a contact hole.

* * * * *